(12) United States Patent
Kai

(10) Patent No.: US 11,894,823 B2
(45) Date of Patent: Feb. 6, 2024

(54) SAW DEVICE MANUFACTURING METHOD

(71) Applicant: DISCO CORPORATION, Tokyo (JP)

(72) Inventor: Kenya Kai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1230 days.

(21) Appl. No.: 16/386,850

(22) Filed: Apr. 17, 2019

(65) Prior Publication Data

US 2019/0326870 A1    Oct. 24, 2019

(30) Foreign Application Priority Data

Apr. 19, 2018  (JP) .................................. 2018-080909

(51) Int. Cl.
 *H03H 3/08* (2006.01)
 *H03H 3/04* (2006.01)
 *H03H 9/02* (2006.01)

(52) U.S. Cl.
 CPC ............... *H03H 3/08* (2013.01); *H03H 3/04* (2013.01); *H03H 9/02559* (2013.01);
 (Continued)

(58) Field of Classification Search
 CPC .. H03H 3/04; H03H 3/08; H03H 3/10; H03H 2003/0407; H03H 2003/0414; H03H 2003/0421; H03H 2003/0435; H03H 2003/0442; H03H 2003/045; H03H 2003/0478; H03H 9/02559; H03H 9/02566; H03H 9/02574; H03H 9/02622; H03H 9/02834; H03H 9/02842; H03H 9/02866;
 (Continued)

(56) References Cited

U.S. PATENT DOCUMENTS

2004/0222717 A1* 11/2004 Matsuda ............ H03H 9/02866
  310/313 R
2007/0257580 A1* 11/2007 Chen ..................... B41J 2/1632
  310/328

(Continued)

FOREIGN PATENT DOCUMENTS

| JP | 05299967 A | 12/1993 |
|----|------------|---------|
| JP | 2015159499 A | 9/2015 |
| JP | 2017126831 A | 7/2017 |

OTHER PUBLICATIONS

Office Action issued in counterpart Japanese application No. 2018-080909, dated Nov. 10, 2022.

*Primary Examiner* — Peter Dungba Vo
*Assistant Examiner* — Joshua D Anderson
(74) *Attorney, Agent, or Firm* — Greer Burns & Crain Ltd.

(57) ABSTRACT

A SAW device manufacturing method includes a piezoelectric ceramic substrate polishing step of polishing a first surface of the piezoelectric ceramic substrate, a support substrate polishing step of polishing a first surface of the support substrate, a bonding step of bonding the first surface of the piezoelectric ceramic substrate to the first surface of the support substrate to thereby form a stacked substrate, a grinding step of grinding a second surface of the piezoelectric ceramic substrate, and a vibration diffusion layer forming step of applying a laser beam to the stacked substrate in the condition where the focal point of the laser beam is positioned inside the piezoelectric ceramic substrate to thereby form a modified layer as a vibration diffusion layer inside the piezoelectric ceramic substrate.

17 Claims, 8 Drawing Sheets

(52) U.S. Cl.
CPC . *H03H 9/02622* (2013.01); *H03H 2003/0435* (2013.01); *Y10T 29/42* (2015.01); *Y10T 29/49005* (2015.01)

(58) Field of Classification Search
CPC ... Y10T 29/42; Y10T 29/49005; H10N 30/05; H10N 30/057; H10N 30/06; H10N 30/072; H10N 30/08; H10N 30/085; H10N 30/086
See application file for complete search history.

(56) References Cited

U.S. PATENT DOCUMENTS

| | | | |
|---|---|---|---|
| 2008/0076256 A1* | 3/2008 | Kawai ................. | B23K 26/389 |
| | | | 257/E21.597 |
| 2017/0033768 A1* | 2/2017 | Aigner ............... | H03H 9/02055 |
| 2017/0047241 A1* | 2/2017 | Priewasser ........... | H01L 21/268 |
| 2017/0063334 A1* | 3/2017 | Abatake ............ | H03H 9/02047 |
| 2017/0201227 A1* | 7/2017 | Shimizu ............ | H03H 9/02866 |
| 2017/0257075 A1* | 9/2017 | Abatake ................ | H03H 9/175 |

\* cited by examiner

SAW DEVICE MANUFACTURING METHOD

BACKGROUND OF THE INVENTION

Field of the Invention

The present invention relates to a SAW device manufacturing method.

Description of the Related Art

A communication terminal such as mobile phone uses an Radio Frequency (RF) filter operating in a band of 800 to 2500 MHz. A SAW (Surface Acoustic Wave) filter is used as the RF filter, in which the SAW filter utilizes a surface wave propagating on the surface of a piezoelectric substrate (see Japanese Patent Laid-Open No. Hei 5-299967, for example). The SAW filter includes a piezoelectric substrate such as a lithium tantalate substrate formed of lithium tantalate ($LiTaO_3$) and a lithium niobate substrate formed of lithium niobate ($LiNbO_3$) and a comb-shaped electrode formed on the piezoelectric substrate.

The use of such a communication terminal is being spread explosively around the world. The frequency band to be utilized for the communication terminal is also spread and each segment divided from the frequency band becomes narrow. Accordingly, high-accuracy filtering is indispensable for the RF filter.

SUMMARY OF THE INVENTION

However, the SAW filter depicted in Japanese Patent Laid-Open No. Hei 5-299967 has a problem such that the piezoelectric substrate such as a lithium tantalate substrate and a lithium niobate substrate may expand and contract due to temperature changes, causing a failure of high-accuracy filtering. To cope with this problem, there has been developed an improved SAW filter manufactured by stacking a thin piezoelectric substrate on a support substrate having a thermal expansion coefficient lower than that of the piezoelectric substrate. This kind of SAW filter can suppress the influence of expansion and contraction due to temperature changes. However, this SAW filter still has a problem such that not only the vibration due to a surface acoustic wave, but also the vibration propagating inside the piezoelectric substrate and reflected on the bottom surface of the piezoelectric substrate may become noise, causing a hindrance to high-accuracy filtering.

It is therefore an object of the present invention to provide a SAW device manufacturing method which can suppress a reduction in filtering accuracy.

In accordance with an aspect of the present invention, there is provided a SAW device manufacturing method including a piezoelectric ceramic substrate providing step of providing a piezoelectric ceramic substrate having a first surface and a second surface opposite to each other; a support substrate providing step of providing a support substrate having a first surface and a second surface opposite to each other, the support substrate having a thermal expansion coefficient lower than that of the piezoelectric ceramic substrate; a piezoelectric ceramic substrate polishing step of polishing the first surface of the piezoelectric ceramic substrate to thereby planarize the first surface of the piezoelectric ceramic substrate; a support substrate polishing step of polishing the first surface of the support sub to thereby planarize the first surface of the support substrate; a bonding step of bonding the first surface of the piezoelectric ceramic substrate to the first surface of the support substrate after performing the piezoelectric ceramic substrate polishing step and the support substrate polishing step, thereby forming a stacked substrate composed of the piezoelectric ceramic substrate and the support substrate; a grinding step of grinding the second surface of the piezoelectric ceramic substrate after performing the bonding step, thereby reducing the thickness of the piezoelectric ceramic substrate to a predetermined thickness; a vibration diffusion layer forming step of applying a laser beam to the stacked substrate in the condition where the focal point of the laser beam is positioned inside the piezoelectric ceramic substrate or inside the support substrate, the laser beam having a transmission wavelength to the piezoelectric substrate or the support substrate, after performing the grinding step, thereby forming a modified layer as a vibration diffusion layer inside the piezoelectric ceramic substrate or inside the support substrate; and an electrode forming step of forming an electrode pattern on the second surface of the piezoelectric ceramic substrate of the stacked substrate after performing the vibration diffusion layer forming step.

Preferably, the laser beam is applied to the piezoelectric ceramic substrate of the stacked substrate in the vibration diffusion layer forming step.

Preferably, the piezoelectric ceramic substrate is formed of lithium tantalate or lithium niobate, and the support substrate is formed of silicon or sapphire.

The present invention has an effect that a reduction in filtering accuracy can be suppressed.

The above and other objects, features, and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
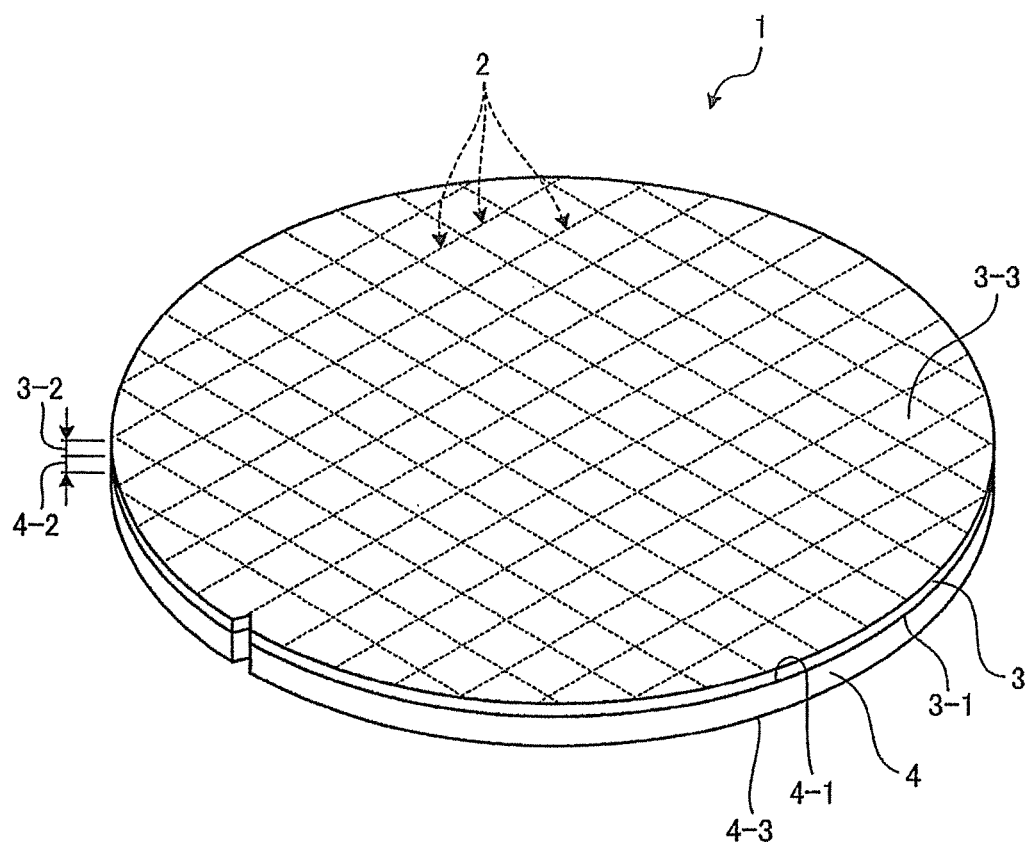
FIG. 1 is a perspective view of a stacked substrate obtained by a SAW device manufacturing method according to a preferred embodiment of the present invention.
Figure 2:
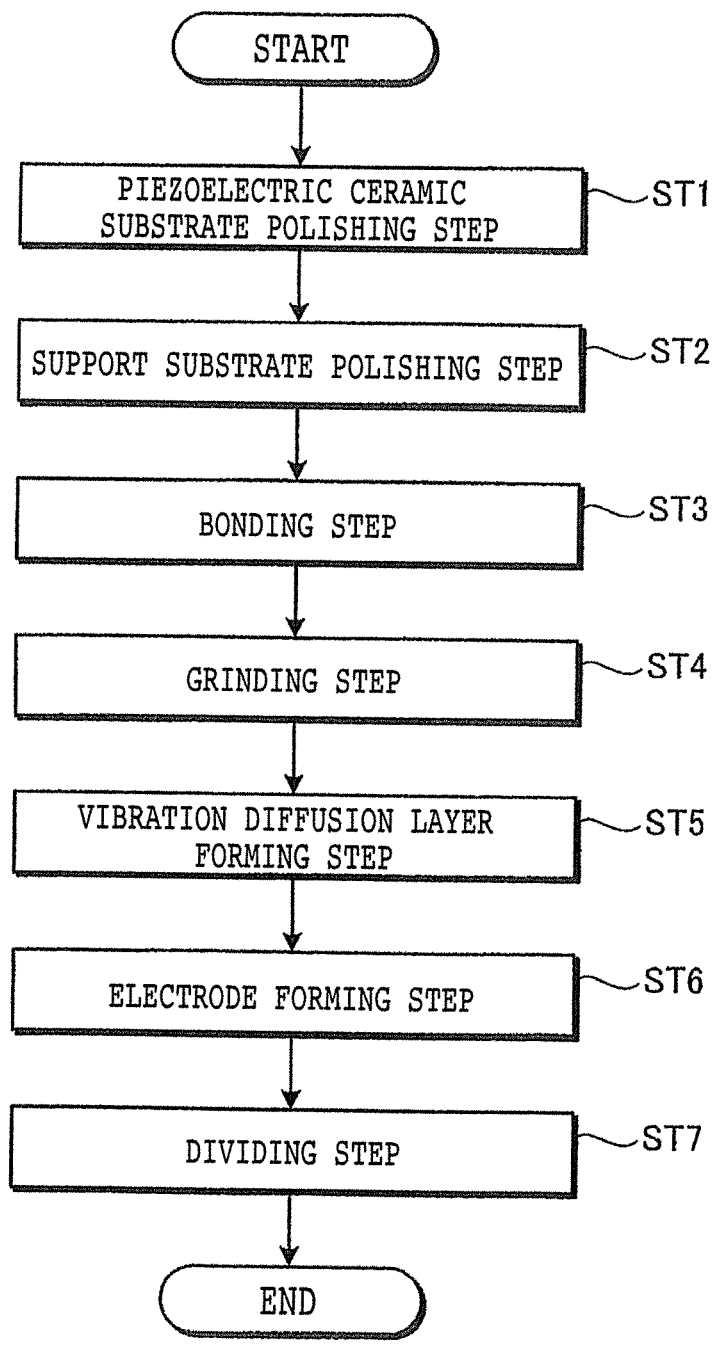
FIG. 2 is a flowchart depicting the flow of the SAW device manufacturing method according to this preferred embodiment.

A SAW device manufacturing method according to a preferred embodiment of the present invention will now be described with reference to the drawings. FIG. 1 is a perspective view of a stacked substrate 1 obtained by the SAW device manufacturing method according to this preferred embodiment. FIG. 2 is a flowchart depicting the flow of the SAW device manufacturing method according to this preferred embodiment.

The SAW device manufacturing method according to this preferred embodiment is a method for forming the stacked substrate 1 depicted in FIG. 1 and then dividing the stacked substrate 1 into a plurality of SAW filters 2 each having a predetermined size. As depicted in FIG. 1, the stacked substrate 1 is composed of a piezoelectric ceramic substrate 3 and a support substrate 4 bonded together. The piezoelectric ceramic substrate 3 has a first surface 3-1 and a second surface 3-3 opposite to each other. The support substrate 4 has a first surface 4-1 and a second surface 4-3 opposite to each other. The stacked substrate 1 is formed by bonding the first surface 3-1 of the piezoelectric ceramic substrate 3 and the first surface 4-1 of the support substrate 4 and then grinding the second surface 3-3 of the piezoelectric ceramic substrate 3 to reduce the thickness of the piezoelectric ceramic substrate 3 to a predetermined thickness 3-2. The support substrate 4 has a predetermined thickness 4-2.

The support substrate 4 has a thermal expansion coefficient lower than that of the piezoelectric ceramic substrate 3. The support substrate 4 is formed of a semiconductor or an insulator. More specifically, the support substrate 4 is formed of silicon or sapphire having a thermal expansion coefficient lower than that of the piezoelectric ceramic substrate 3. However, the material of the support substrate 4 is not limited to silicon or sapphire in the present invention. In this preferred embodiment, the thickness 4-2 of the support substrate 4 is in the range of 100 to 300 μm.

The piezoelectric ceramic substrate 3 is a lithium tantalate substrate formed of lithium tantalate ($LiTaO_3$) or a lithium niobate substrate formed of lithium niobate ($LiNbO_3$). Both the lithium tantalate and the lithium niobate are piezoelectric ceramic. In this preferred embodiment, the thickness 3-2 of the piezoelectric ceramic substrate 3 is in the range of 1 to 15 μm. Although not depicted in FIG. 1, a plurality of comb-shaped electrode patterns are formed on the second surface 3-3 of the piezoelectric ceramic substrate 3.

In the stacked substrate 1, the first surface 3-1 of the piezoelectric ceramic substrate 3 and the first surface 4-1 of the support substrate 4 are bonded by cold bonding. Both the piezoelectric ceramic substrate 3 and the support substrate 4 are disk-shaped members having the same outer diameter in this preferred embodiment.

The SAW device manufacturing method according to this preferred embodiment is a method for forming the stacked substrate 1 depicted in FIG. 1 and then dividing the stacked substrate 1 to obtain the plural SAW filters 2. In this preferred embodiment, each SAW filter 2 is a SAW device for extracting only an electrical signal in a predetermined frequency band.

As depicted in FIG. 2, the SAW device manufacturing method according to this preferred embodiment includes a piezoelectric ceramic substrate polishing step ST1, support substrate polishing step ST2, bonding step ST3, grinding step ST4, vibration diffusion layer forming step ST5, electrode forming step ST6, and dividing step ST7.

(Piezoelectric Ceramic Substrate Polishing Step)

Figure 3:
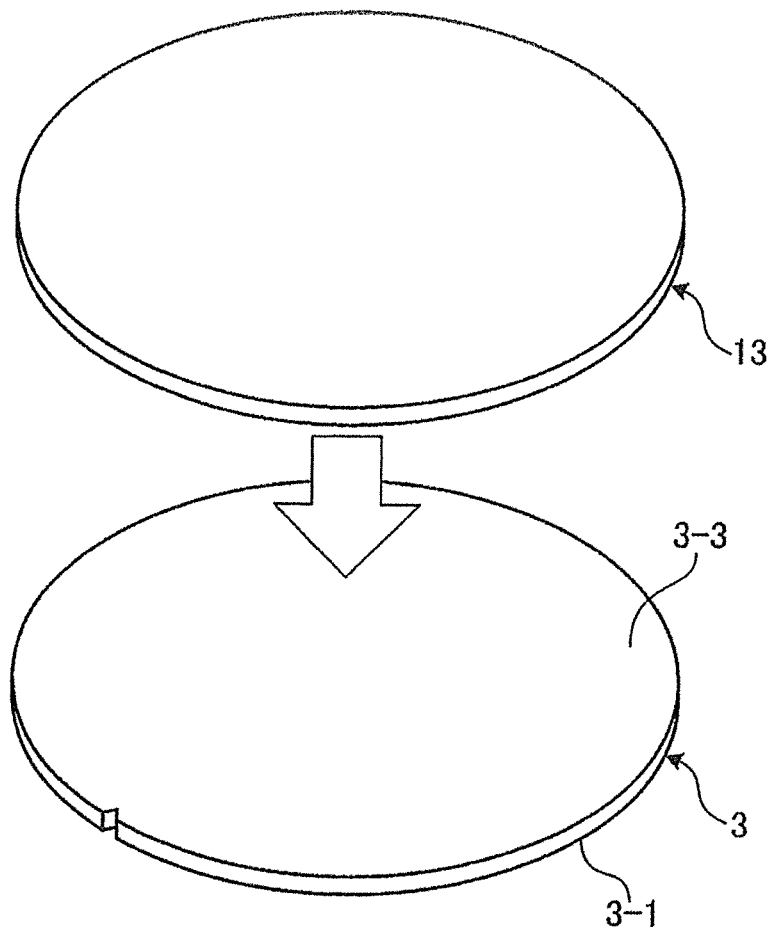
FIG. 3 is a perspective view depicting a step of attaching a protective member to a piezoelectric ceramic substrate in a piezoelectric ceramic substrate polishing step of the method depicted in FIG. 2.
Figure 4:
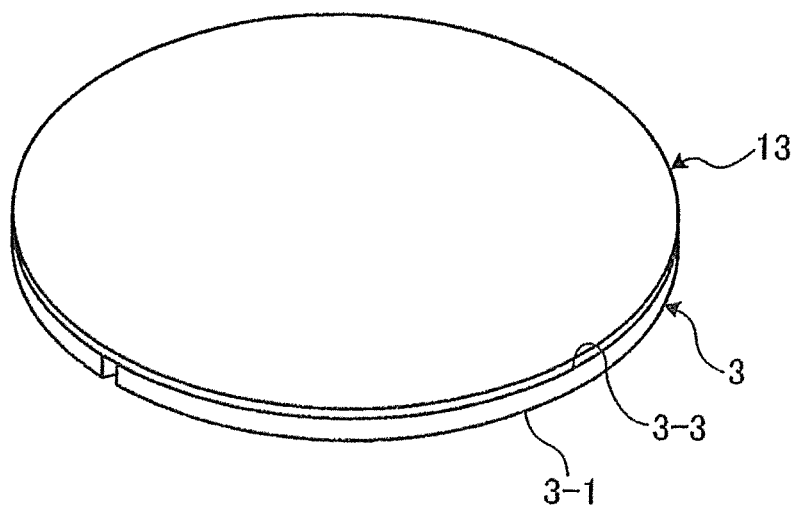
FIG. 4 is a perspective view depicting a step of attaching a protective member to a piezoelectric ceramic substrate in a piezoelectric ceramic substrate polishing step of the method depicted in FIG. 2.
Figure 5:
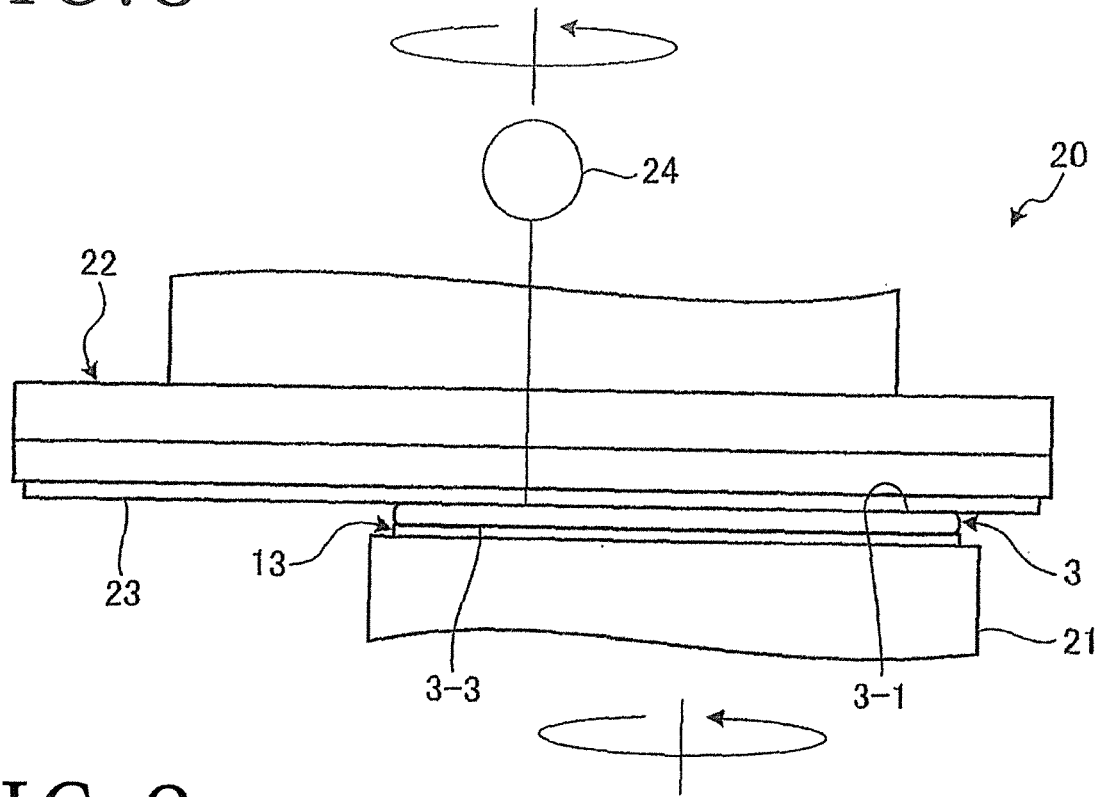
FIG. 5 is a side view depicting the piezoelectric ceramic substrate polishing step of the method depicted in FIG. 2.

FIG. 3 is a perspective view depicting a condition before attaching a protective member 13 to the second surface 3-3 of the piezoelectric ceramic substrate 3 in the piezoelectric ceramic substrate polishing step ST1 of the SAW device manufacturing method depicted in FIG. 2. FIG. 4 is a perspective view depicting a condition after attaching the protective member 13 to the second surface 3-3 of the piezoelectric ceramic substrate 3 in the piezoelectric ceramic substrate polishing step ST1 of the SAW device manufacturing method depicted in FIG. 2. FIG. 5 is a side view depicting the piezoelectric ceramic substrate polishing step ST1 of the SAW device manufacturing method depicted in FIG. 2.

The piezoelectric ceramic substrate polishing step ST1 is the step of polishing the first surface 3-1 of the piezoelectric ceramic substrate 3 to thereby planarize the first surface 3-1. In this preferred embodiment, the piezoelectric ceramic substrate polishing step ST1 includes the step of opposing the protective member 13 to the second surface 3-3 of the piezoelectric ceramic substrate 3 with a spacing defined therebetween as depicted in FIG. 3 and the step of attaching the protective member 13 to the second surface 3-3 of the piezoelectric ceramic substrate 3 as depicted in FIG. 4. That is, the protective member 13 is attached to the second surface 3-3 of the piezoelectric ceramic substrate 3 before polishing the first surface 3-1 of the piezoelectric ceramic substrate 3.

As depicted in FIG. 5, the piezoelectric ceramic substrate polishing step ST1 is performed by using a polishing apparatus 20 having a chuck table 21 and a polishing unit 22. The polishing unit 22 has a polishing pad 23 for polishing the first surface 3-1 of the piezoelectric ceramic substrate 3. The piezoelectric ceramic substrate 3 with the protective member 13 is held under suction on the chuck table 21 in such a manner that the protective member 13 is in contact with the upper surface of the chuck table 21, i.e., the second surface 3-3 of the piezoelectric ceramic substrate 3 is held through the protective member 13 on the upper surface of the chuck table 21. In this condition, the chuck table 21 is rotated about its axis, and the polishing pad 23 of the polishing unit 22 is also rotated about its axis. Thereafter, the polishing pad 23 is brought into contact with the first surface 3-1 of the piezoelectric ceramic substrate 3, thereby polishing the first surface 3-1 to planarize the same. In this preferred embodiment, the first surface 3-1 of the piezoelectric ceramic substrate 3 is polished by performing CMP (Chemical Mechanical Polishing) as supplying an alkaline polishing liquid (slurry) from a polishing liquid source 24. As a modification, the first surface 3-1 of the piezoelectric ceramic substrate 3 may be polished by dry polishing without supplying a polishing liquid. After performing the piezoelectric ceramic substrate polishing step ST1, the process proceeds to the support substrate polishing step ST2.

(Support Substrate Polishing Step)

Figure 6:
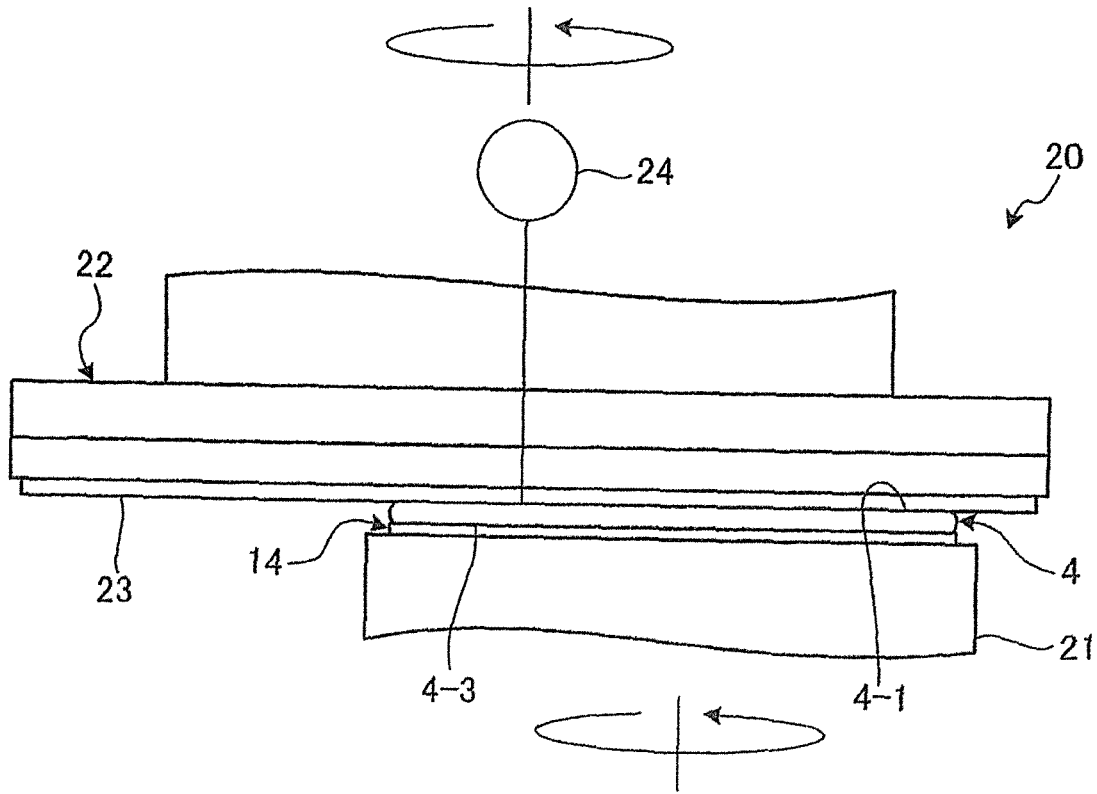
FIG. 6 is a side view depicting a support substrate polishing step of the method depicted in FIG. 2.

FIG. 6 is a side view depicting the support sub polishing step ST2 of the SAW device manufacturing method depicted in FIG. 2. The support substrate polishing step ST2 is the step of polishing the first surface 4-1 of the support substrate 4 having a thermal expansion coefficient lower than that of the piezoelectric ceramic substrate 3 to thereby planarize the first surface 4-1.

In this preferred embodiment, the support substrate polishing step ST2 includes the step of attaching a protective member 14 to the second surface 4-3 of the support substrate 4. That is, the protective member 14 is attached to the second surface 4-3 of the support substrate 4 before polishing the first surface 4-1 of the support substrate 4. As depicted in FIG. 6, the support substrate polishing step ST2 is performed by using a polishing apparatus 20 similar to that depicted in FIG. 5. The support substrate 4 with the protective member 14 is held under suction on the chuck table 21 in such a manner that the protective member 14 is in contact with the upper surface of the chuck table 21, i.e., the second surface 4-3 of the support substrate 4 is held through the protective member 14 on the upper surface of the chuck table 21. In this condition, the chuck table 21 is rotated about its axis, and the polishing pad 23 of the polishing unit 22 is also rotated about its axis. Thereafter, the polishing pad 23 is brought into contact with the first surface 4-1 of the support substrate 4, thereby polishing the first surface 4-1 to planarize the same. In this preferred embodiment, the first surface 4-1 of the support substrate 4 is polished by performing CMP (Chemical Mechanical Polishing) as supplying an alkaline polishing liquid (slurry) from a polishing liquid source 24. As a modification, the first surface 4-1 of the support substrate 4 may be polished by the polishing pad 23 as supplying a polishing liquid such as pure water from the polishing liquid source 24. Further, the first surface 4-1 of the support substrate 4 may be polished by dry polishing without supplying a polishing liquid. After performing the support substrate polishing step ST2, the process proceeds to the bonding step ST3.

(Bonding Step)

Figure 7:
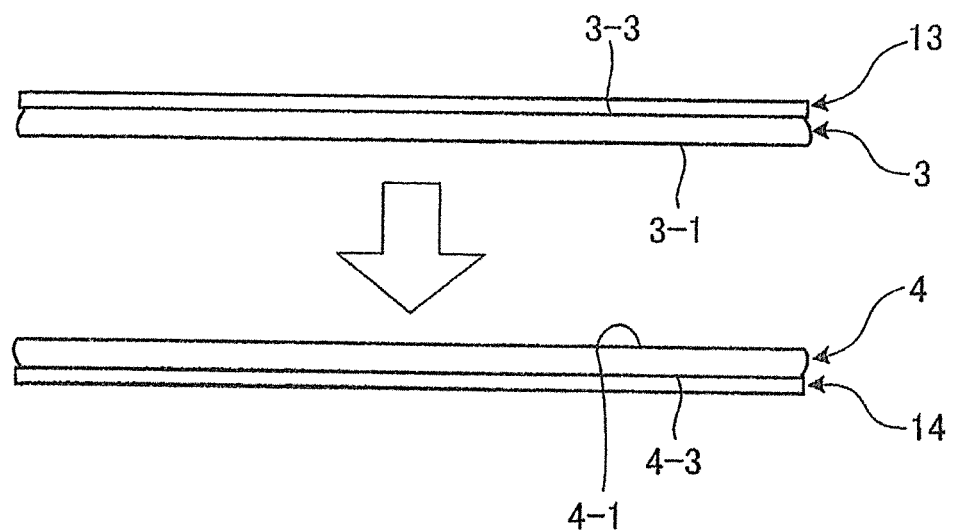
FIG. 7 is a side view depicting a condition where a first surface of the piezoelectric ceramic substrate is opposed to a first surface of a support substrate in a bonding step of the method depicted in FIG. 2.
Figure 8:
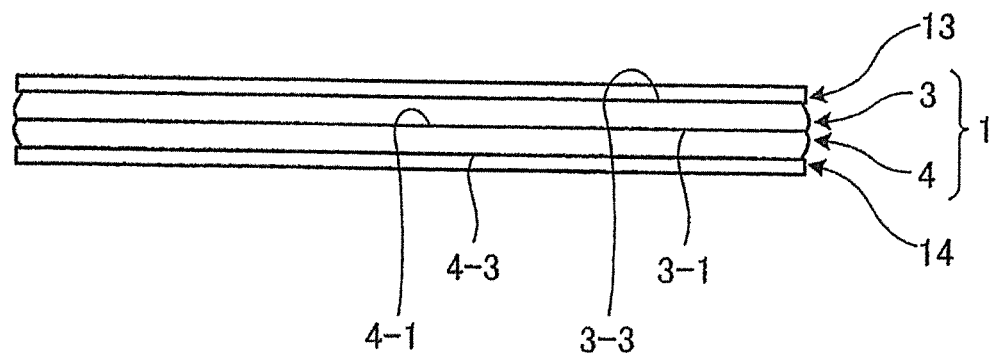
FIG. 8 is a side view depicting a stacked substrate formed in the bonding step of the method depicted in FIG. 2.

FIG. 7 is a side view depicting a condition where the first surface 3-1 of the piezoelectric ceramic substrate 3 is opposed to the first surface 4-1 of the support substrate 4 in the bonding step ST3 of the SAW device manufacturing method depicted in FIG. 2. FIG. 8 is a side view depicting a stacked substrate 1 formed in the bonding step ST3 of the SAW device manufacturing method depicted in FIG. 2. The bonding step ST3 is the step of bonding the first surface 3-1 of the piezoelectric ceramic substrate 3 polished in the piezoelectric ceramic substrate polishing step ST1 to the first surface 4-1 of the support substrate 4 polished in the support substrate polishing step ST2, thereby forming the stacked substrate 1.

In this preferred embodiment, the bonding step ST3 is performed in a vacuum chamber (not depicted). That is, the piezoelectric ceramic substrate 3 and the support substrate 4 are loaded into the vacuum chamber, and the first surface 3-1 of the piezoelectric ceramic substrate 3 is opposed to the first surface 4-1 of the support substrate 4 with a spacing defined therebetween as depicted in FIG. 7. Thereafter, the vacuum chamber is evacuated and an ion beam or an atomic beam is applied to both the first surfaces 3-1 and 4-1 to thereby activate the first surfaces 3-1 and 4-1. Thereafter, the first surface 3-1 of the piezoelectric ceramic substrate 3 is bonded to the first surface 4-1 of the support substrate 4 as depicted in FIG. 8. That is, in this preferred embodiment, the first surface 3-1 of the piezoelectric ceramic substrate 3 is bonded to the first surface 4-1 of the support substrate 4 by cold bonding to thereby form the stacked substrate 1. After performing the bonding step ST3, the process proceeds to the grinding step ST4.

(Grinding Step)

Figure 9:
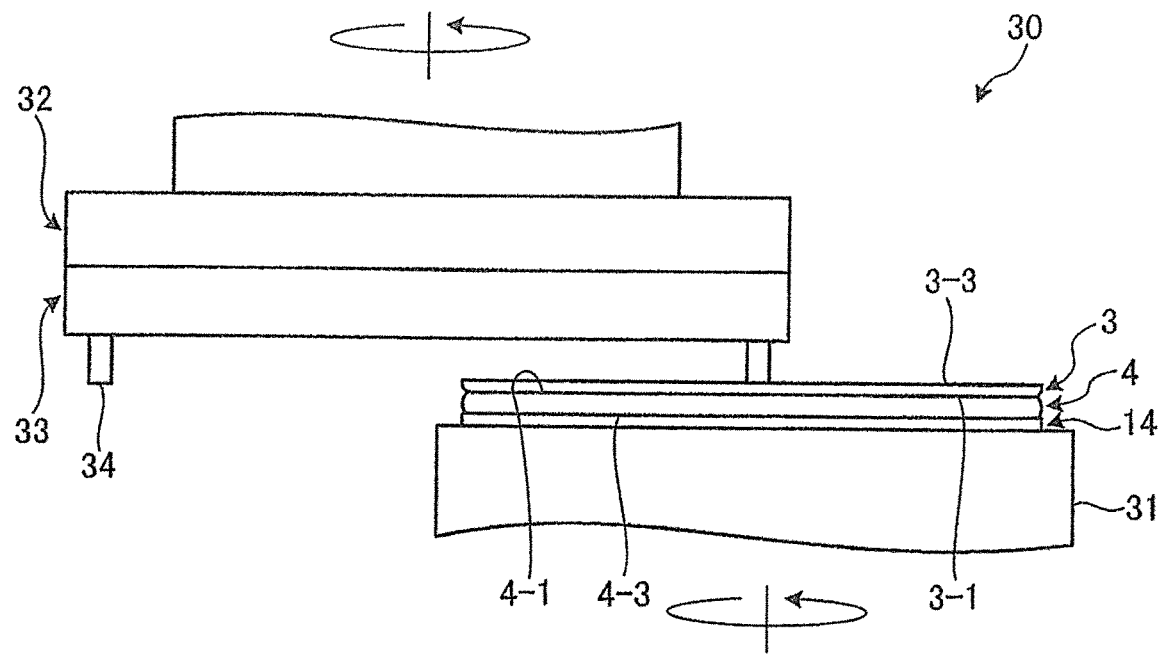
FIG. 9 is a side view depicting a grinding step of the method depicted in FIG. 2.

FIG. 9 is a side view depicting the grinding step ST4 of the SAW device manufacturing method depicted in FIG. 2. The grinding step ST4 is the step of grinding the second surface 3-3 of the piezoelectric ceramic substrate 3 after performing the bonding step ST3, thereby reducing the thickness of the piezoelectric ceramic substrate 3 to the predetermined thickness 3-2.

In this preferred embodiment, the grinding step ST4 includes the step of peeling the protective member 13 from the second surface 3-3 of the piezoelectric ceramic substrate 3 before grinding the second surface 3-3. As depicted in FIG. 9, the grinding step ST4 is performed by using a grinding apparatus 30 including a chuck table 31 and a grinding unit 32 having a grinding wheel 33. The grinding wheel 33 has a plurality of abrasive members 34 for grinding the second surface 3-3 of the piezoelectric ceramic substrate 3. The plurality of abrasive members 34 are annularly arranged along the outer circumference of the grinding wheel 33. After peeling the protective member 13, the stacked substrate 1 is held under suction on the chuck table 31 in such a manner that the protective member 14 is in contact with the upper surface of the chuck table 31, i.e., the second surface 4-3 of the support substrate 4 is held through the protective member 14 on the upper surface of the chuck table 31. That is, the second surface 3-3 of the piezoelectric ceramic substrate 3 of the stacked substrate 1 is exposed upward on the chuck table 31. In this condition, the chuck table 31 is rotated about its axis, and the grinding wheel 33 of the grinding unit 32 is also rotated about its axis. Thereafter, the abrasive members 34 of the grinding wheel 33 are brought into contact with the second surface 3-3 of the piezoelectric ceramic substrate 3, thereby grinding the second surface 3-3 to reduce the thickness of the piezoelectric ceramic substrate 3 to the predetermined thickness 3-2. In this preferred embodiment, the grinding step ST4 further includes the step of polishing the second surface 3-3 of the piezoelectric ceramic substrate 3 after grinding the second surface 3-3. More specifically, after grinding the second surface 3-3 of the piezoelectric ceramic substrate 3 as mentioned above, the second surface 3-3 of the piezoelectric ceramic substrate 3 is polished by using the polishing apparatus 20 depicted in FIG. 5 in a manner similar to the piezoelectric ceramic substrate polishing step ST1. That is, the second surface 4-3 of the support substrate 4 is held under suction through the protective member 14 on the upper surface of the chuck table 21 of the polishing apparatus 20. Thereafter, the second surface 3-3 of the piezoelectric ceramic substrate 3 ground above is polished by the polishing pad 23 to thereby perform planarization. After performing the grinding step ST4, the process proceeds to the vibration diffusion layer forming step ST5.

(Vibration Diffusion Layer Forming Step)

Figure 10:
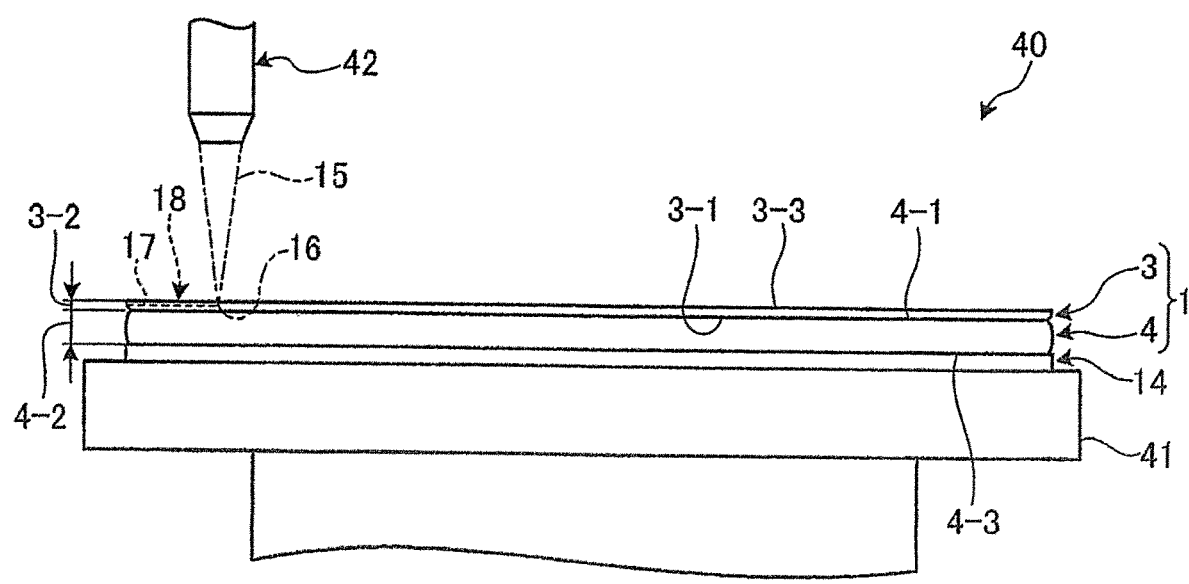
FIG. 10 is a side view depicting a vibration diffusion layer forming step of the method depicted in FIG. 2.
Figure 11:
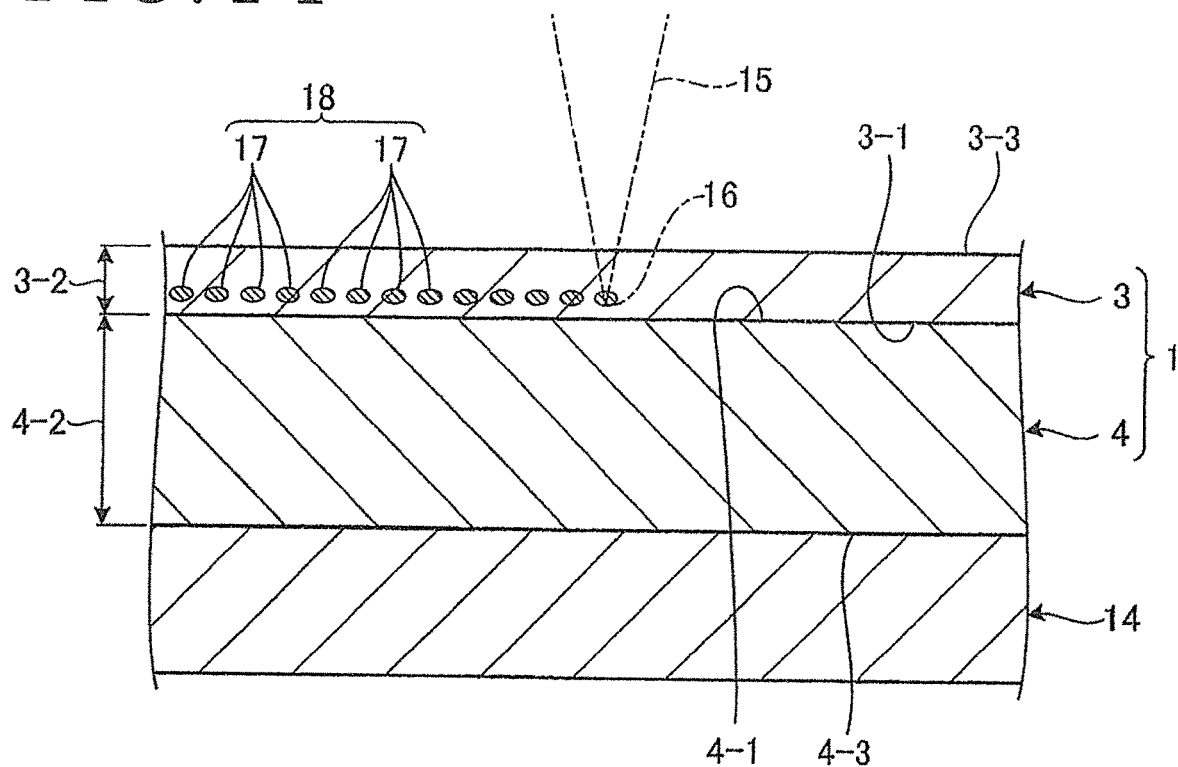
FIG. 11 is an enlarged sectional view depicting an essential part such as of a piezoelectric ceramic substrate in a vibration diffusion layer forming step of the method depicted in FIG. 2.

FIG. 10 is a side view depicting the vibration diffusion layer forming step ST5 of the SAW device manufacturing method depicted in FIG. 2. FIG. 11 is an enlarged sectional view depicting an essential part of the stacked substrate 1 in the vibration diffusion layer forming step ST5 of the SAW device manufacturing method depicted in FIG. 2.

The vibration diffusion layer forming step ST5 is the step of applying a laser beam 15 to the piezoelectric ceramic substrate 3 in the condition where the focal point 16 of the laser beam 15 is positioned inside the piezoelectric ceramic substrate 3, the laser beam 15 having a transmission wavelength to the piezoelectric ceramic substrate 3, after performing the grinding step ST4, thereby forming a plurality of modified layers 17 inside the piezoelectric ceramic substrate 3, in which the plurality of modified layers 17 constitute a vibration diffusion layer 18. As depicted in FIGS. 10 and 11, the vibration diffusion layer forming step ST5 is performed by using a laser processing apparatus 40 having a chuck table 41 and a laser beam applying unit 42 for applying the laser beam 15. After grinding the second surface 3-3 of the piezoelectric ceramic substrate 3 and then polishing the second surface 3-3 as mentioned above, the stacked substrate 1 is held under suction on the chuck table 41 in such a manner that the protective member 14 is in contact with the upper surface of the chuck table 41, i.e., the second surface 4-3 of the support substrate 4 is held through the protective member 14 on the upper surface of the chuck table 41. That is, the second surface 3-3 of the piezoelectric ceramic substrate 3 of the stacked substrate 1 is exposed upward on the chuck table 41. In this condition, the laser beam 15 is applied from the laser beam applying unit 42 to the piezoelectric ceramic substrate 3 of the stacked substrate 1.

In the vibration diffusion layer forming step ST5, before applying the laser beam 15, the focal point 16 of the laser beam 15 to be applied is set inside the piezoelectric ceramic substrate 3 as depicted in FIG. 11. Thereafter, the laser beam 15 is applied to the piezoelectric ceramic substrate 3 as relatively moving the chuck table 41 and the laser beam applying unit 42. In the vibration diffusion layer forming step ST5, as a result, the plural modified layers 17 are formed inside the piezoelectric ceramic substrate 3 so as to be arranged at equal intervals as depicted in FIG. 11.

In this preferred embodiment, the laser beam 15 is applied under the following conditions.

Wavelength: 1064 nm ($YVO_4$ pulsed laser)
Repetition frequency: 50 to 120 KHz
Power: 0.1 to 0.3 W Each modified layer 17 means a region where physical properties such as density, refractive index, and mechanical strength are different from those in its surrounding region. Examples of such a region include a melted region, cracked region, dielectric breakdown region, refractive index changed region, and mixture thereof. Accordingly, when vibration propagating inside the piezoelectric ceramic substrate 3 collides with each modified layer 17, the vibration is diffused by each modified layer 17. After performing the vibration diffusion layer forming step ST5, the process proceeds to the electrode forming step ST6.

(Electrode Forming Step)

Figure 12:
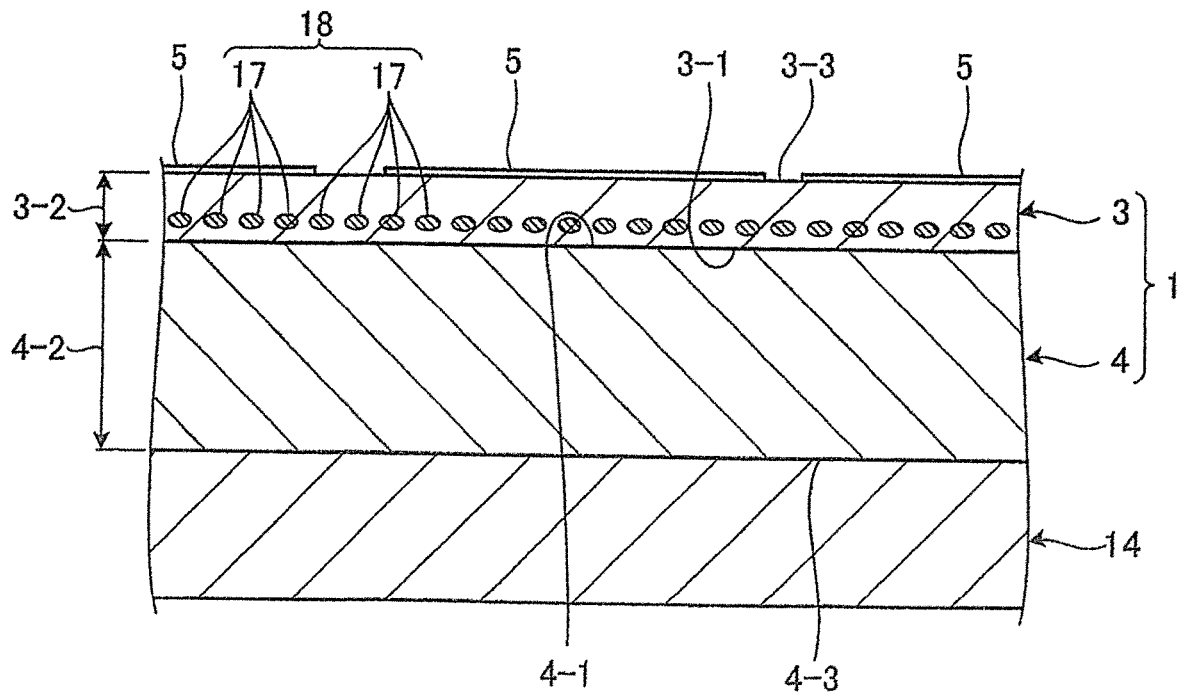
FIG. 12 is an enlarged sectional view depicting an essential part such as of a piezoelectric ceramic substrate in condition after performing an electrode forming step of the method depicted in FIG. 2.

FIG. 12 is an enlarged sectional view depicting an essential part of the stacked substrate 1 in the condition after performing the electrode forming step ST6 of the SAW device manufacturing method depicted in FIG. 2. The electrode forming step ST6 is the step of forming a plurality of electrode patterns 5 on the second surface 3-3 of the piezoelectric ceramic substrate 3 after performing the vibration diffusion layer forming step ST5. In this preferred embodiment, each electrode pattern 5 is formed from a thin film of aluminum or aluminum alloy, in which an electrical signal having a predetermined frequency can be extracted from each electrode pattern 5. Each electrode pattern 5 is a comb-shaped pattern. After performing the electrode forming step ST6, the process proceeds to the dividing step ST7.

(Dividing Step)

Figure 13:
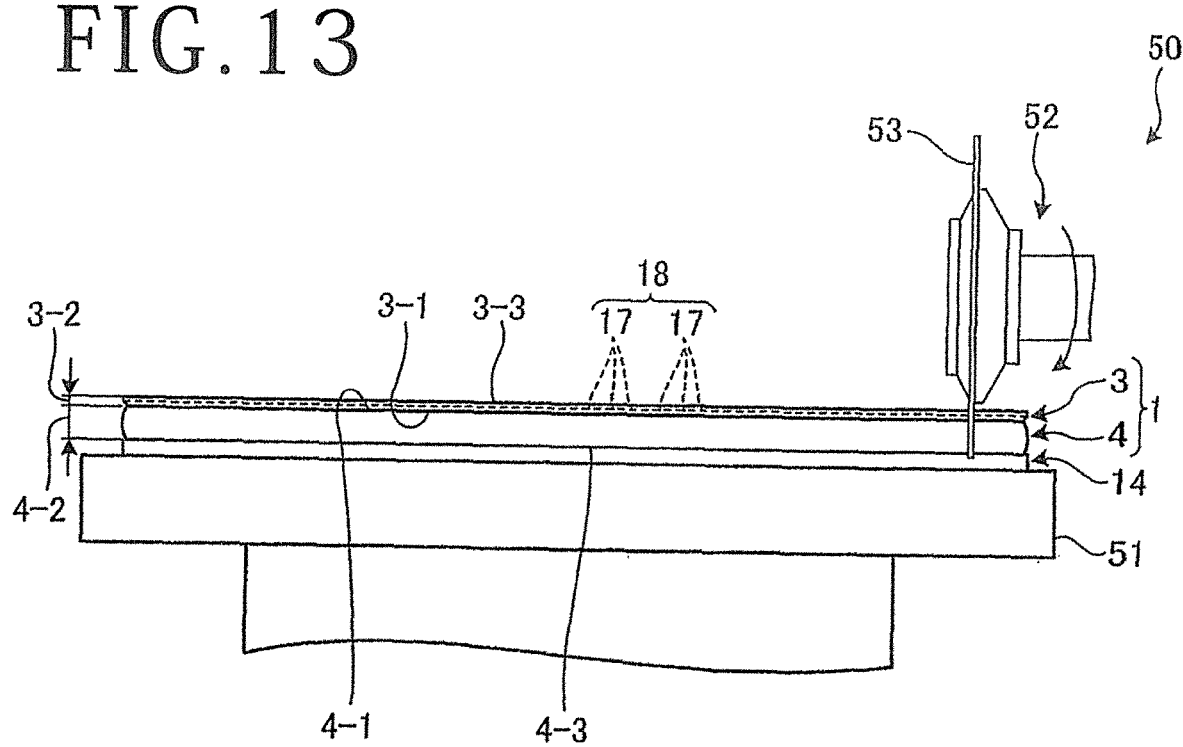
FIG. 13 is a side view depicting a dividing step of the method depicted in FIG. 2.

FIG. 13 is a side view depicting the dividing step ST7 of the SAW device manufacturing method depicted in FIG. 2. The dividing step ST7 is the step of cutting the stacked substrate 1 after performing the electrode forming step ST6, thereby dividing the stacked substrate 1 into the individual SAW filters 2. In FIG. 13, the electrode patterns 5 are not depicted for convenience of illustration.

As depicted in FIG. 13, the dividing step ST7 is performed by using a cutting apparatus 50 having a chuck table 51 and a cutting unit 52 having a cutting blade 53 for cutting the stacked substrate 1. In the dividing step ST7, the stacked substrate 1 is held under suction on the chuck table 51 in such a manner that the protective member 14 is in contact with the upper surface of the chuck table 51, i.e., the second surface 4-3 of the support substrate 4 is held through the protective member 14 on the upper surface of the chuck table 51. That is, the second surface 3-3 of the piezoelectric ceramic substrate 3 of the stacked substrate 1 is exposed upward on the chuck table 51. In this condition, alignment is performed and the cutting blade 53 is rotated to cut the stacked substrate 1 until the lower end of the cutting blade 53 reaches the protective member 14. In this condition, the chuck table 51 and the cutting unit 52 are relatively moved. As a result, the stacked substrate 1 is divided into the individual SAW filters 2. After performing the dividing step ST7, the process is ended. Each SAW filter 2 obtained by the dividing step ST7 is picked up from the protective member 14 by a pickup apparatus (not depicted).

As described above, the SAW device manufacturing method according to this preferred embodiment includes the vibration diffusion layer forming step ST5, in which the vibration diffusion layer 18 composed of the plural modified layers 17 is formed inside the piezoelectric ceramic substrate 3 by applying the laser beam 15 to the piezoelectric ceramic substrate 3. Each modified layer 17 formed inside the piezoelectric ceramic substrate 3 functions to diffuse the vibration propagating inside the piezoelectric ceramic substrate 3. Accordingly, it is possible to suppress the extraction of the vibration propagating inside the piezoelectric ceramic substrate 3 when each SAW filter 2 extracts an electrical signal having a predetermined frequency of surface acoustic wave. That is, it is possible to suppress that the vibration propagating inside the piezoelectric ceramic substrate 3 may become noise to the electrical signal having a predetermined frequency of surface acoustic wave. Accordingly, it is possible to suppress an error in the frequency of the electrical signal to be extracted by each SAW filter 2. In other words, it is possible to suppress a reduction in filtering accuracy of each SAW filter 2.

In the vibration diffusion layer forming step ST5 of the SAW device manufacturing method according to this preferred embodiment, the laser beam 15 is applied to the piezoelectric ceramic substrate 3 so as to be focused inside the piezoelectric ceramic substrate 3, so that damage to the support substrate 4 due to the laser beam 15 can be suppressed.

Figure 14:
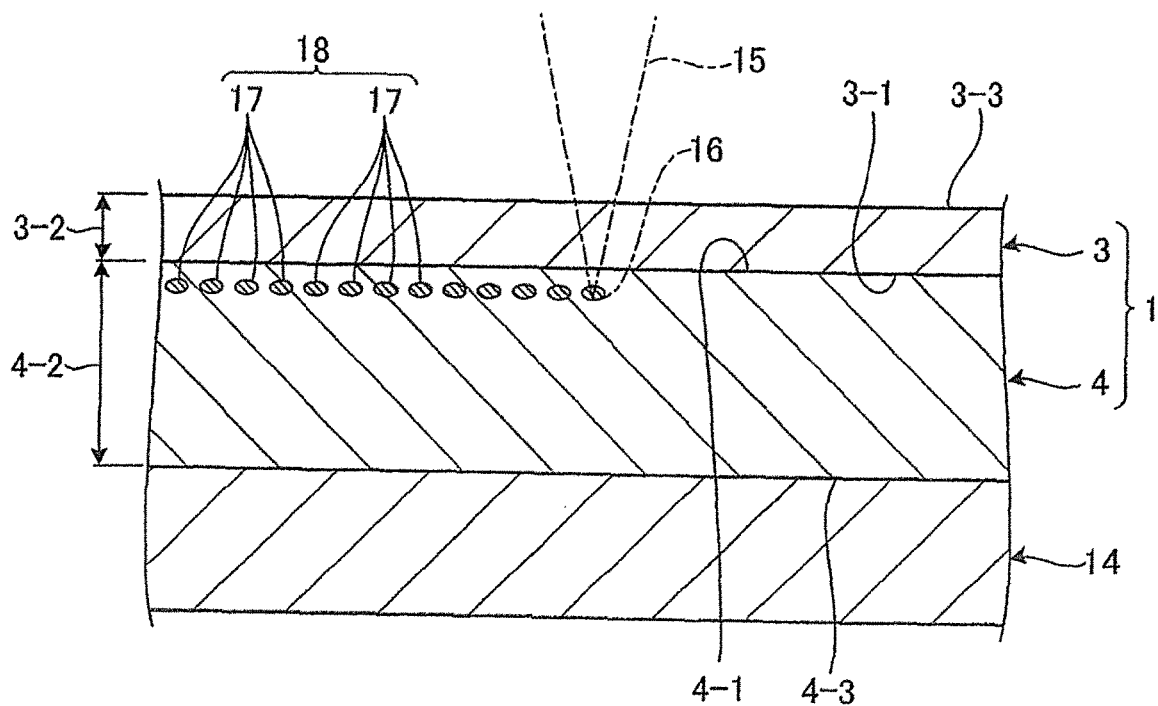
FIG. 14 is an enlarged sectional view depicting a vibration diffusion layer forming step of a SAW device manufacturing method according to a modification of this preferred embodiment.

A modification of the above preferred embodiment will now be described with reference to FIG. 14. FIG. 14 is an enlarged sectional view depicting an essential part of the stacked substrate 1 in the vibration diffusion layer forming step ST5 of the SAW device manufacturing method according to this modification. In FIG. 14, the same parts as those in the above preferred embodiment are denoted by the same reference numerals, and the description thereof will be omitted accordingly.

The vibration diffusion layer forming step ST5 of the SAW device manufacturing method according to this modification is different from that according to the above preferred embodiment in only the point that the vibration diffusion layer 18 composed of the plural modified layers 17 is formed inside the support substrate 4 in this modification. The other steps in this modification are the same as those in the above preferred embodiment.

The vibration diffusion layer forming step ST5 in this modification is the step of applying a laser beam 15 to the piezoelectric ceramic substrate 3 in the condition where the focal point 16 of the laser beam 15 is positioned inside the support substrate 4, the laser beam 15 having a transmission wavelength to the piezoelectric ceramic substrate 3 and the support substrate 4, after performing the grinding step ST4, thereby forming a plurality of modified layers 17 inside the support substrate 4, in which the plurality of modified layers 17 constitute a vibration diffusion layer 18. In this modification, the vibration diffusion layer forming step ST5 is performed by using a laser processing apparatus 40 similar to that depicted in FIG. 14. That is, the stacked substrate 1 is held under suction on the chuck table 41 in such a manner that the second surface 4-3 of the support substrate 4 is held through the protective member 14 on the upper surface of the chuck table 41. That is, the second surface 3-3 of the piezoelectric ceramic substrate 3 of the stacked substrate 1 is exposed upward on the chuck table 41. In this condition, the laser beam 15 is applied to the piezoelectric ceramic substrate 3 of the stacked substrate 1.

Before applying the laser beam 15, the focal point 16 of the laser beam 15 to be applied is set inside the support substrate 4 as depicted in FIG. 14. Thereafter, the laser beam 15 is applied to the piezoelectric ceramic substrate 3 as relatively moving the chuck table 41 and the laser beam applying unit 42. As a result, the plural modified layers 17 are formed inside the support substrate 4 so as to be arranged at equal intervals as depicted in FIG. 14. In this modification, the modified layers 17 are formed inside the support substrate 4 at the depth near the first surface 4-1 of the support substrate 4, i.e., the depth higher in level than the middle of the thickness of the support substrate 4 as depicted in FIG. 14. However, the position of formation of the modified layers 17 inside the support substrate 4 is not limited to the position depicted in FIG. 14.

In this modification, the laser beam 15 is applied under the following conditions.

Wavelength: 1064 nm ($YVO_4$ pulsed laser)
Repetition frequency: 50 to 120 kHz
Power: 0.1 to 0.3 W When vibration propagating inside the piezoelectric ceramic substrate 3 and then propagating inside the support substrate 4 collides with each modified layer 17 formed inside the support substrate 4, the vibration is diffused by each modified layer 17.

In the vibration diffusion layer forming step ST5 of the SAW device manufacturing method according to this modification, the vibration diffusion layer 18 composed of the plural modified layers 17 is formed inside the support substrate 4 by applying the laser beam 15 to the piezoelectric ceramic substrate 3. Each modified layer 17 formed inside the support substrate 4 functions to diffuse the vibration propagating inside the piezoelectric ceramic substrate 3 and the support substrate 4. As a result, it is possible to suppress a reduction in filtering accuracy of each SAW filter 2 as similar to the effect obtained in the above preferred embodiment.

The present invention is not limited to the above preferred embodiment and the above modification, but various other modifications may be made within the scope of the present invention. For example, in the vibration diffusion layer forming step ST5, the laser beam 15 may be applied to the support substrate 4 of the stacked substrate 1, thereby forming the modified layers 17 inside the piezoelectric ceramic substrate 3 or inside the support substrate 4.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A surface acoustic wave device manufacturing method comprising:
   a piezoelectric ceramic substrate providing step of providing a piezoelectric ceramic substrate having a first surface and a second surface opposite to each other;
   a support substrate providing step of providing a support substrate having a first surface and a second surface opposite to each other, the support substrate having a thermal expansion coefficient lower than that of the piezoelectric ceramic substrate;
   a support substrate protective member applying step of applying a protective member to the second surface of the support substrate;
   a piezoelectric ceramic substrate polishing step of polishing the first surface of the piezoelectric ceramic substrate to thereby planarize the first surface of the piezoelectric ceramic substrate;
   a support substrate polishing step of polishing the first surface of the support substrate to thereby planarize the first surface of the support substrate by holding the second surface of the support substrate through the support substrate protective member on an upper surface of a chuck table and polishing the first surface of the support substrate;
   a bonding step of bonding the first surface of the piezoelectric ceramic substrate to the first surface of the support substrate after performing the piezoelectric ceramic substrate polishing step and the support substrate polishing step, thereby forming a stacked substrate composed of the piezoelectric ceramic substrate and the support substrate;
   a grinding step of grinding the second surface of the piezoelectric ceramic substrate of the stacked substrate after performing the bonding step while holding the second surface of the support substrate through the support substrate protective member on an upper surface of a chuck table, thereby reducing a thickness of the piezoelectric ceramic substrate to a predetermined thickness;
   a vibration diffusion layer forming step of applying a laser beam to the stacked substrate in a condition where a focal point of the laser beam is positioned inside the piezoelectric ceramic substrate while holding the second surface of the support substrate through the support substrate protective member on an upper surface of a chuck table after performing the grinding step, the laser beam having a transmission wavelength to the piezoelectric ceramic substrate, thereby forming a modified layer as a vibration diffusion layer inside the piezoelectric ceramic substrate; and an electrode forming step of forming an electrode pattern on the second surface of the piezoelectric ceramic substrate of the stacked substrate after performing the vibration diffusion layer forming step.

2. The surface acoustic wave device manufacturing method according to claim 1,
wherein the laser beam is applied to the piezoelectric ceramic substrate of the stacked substrate in the vibration diffusion layer forming step.

3. The surface acoustic wave device manufacturing method according to claim 1,
wherein the piezoelectric ceramic substrate is formed of lithium tantalate or lithium niobate, and the support substrate is formed of silicon or sapphire.

4. The surface acoustic wave device manufacturing method according to claim 1, further comprising:
a piezoelectric ceramic substrate protective member applying step of applying a protective member to the second surface of the piezoelectric ceramic substrate,
wherein the piezoelectric ceramic substrate polishing step includes holding the second surface of the piezoelectric ceramic substrate through the piezoelectric ceramic substrate protective member on the upper surface of the chuck table and polishing the first surface of the piezoelectric ceramic substrate.

5. The surface acoustic wave device manufacturing method according to claim 1,
wherein the first surface of the piezoelectric ceramic substrate is bonded to the first surface of the support substrate by cold bonding.

6. A surface acoustic wave device manufacturing method comprising:
a piezoelectric ceramic substrate providing step of providing a piezoelectric ceramic substrate having a first surface and a second surface opposite to each other;
a support substrate providing step of providing a support substrate having a first surface and a second surface opposite to each other, the support substrate having a thermal expansion coefficient lower than that of the piezoelectric ceramic substrate;
a piezoelectric ceramic substrate polishing step of polishing the first surface of the piezoelectric ceramic substrate to thereby planarize the first surface of the piezoelectric ceramic substrate;
a support substrate polishing step of polishing the first surface of the support substrate to thereby planarize the first surface of the support substrate;
a bonding step of bonding the first surface of the piezoelectric ceramic substrate to the first surface of the support substrate after performing the piezoelectric ceramic substrate polishing step and the support substrate polishing step, thereby forming a stacked substrate composed of the piezoelectric ceramic substrate and the support substrate;
a grinding step of grinding the second surface of the piezoelectric ceramic substrate of the stacked substrate after performing the bonding step, thereby reducing a thickness of the piezoelectric ceramic substrate to a predetermined thickness;
a vibration diffusion layer forming step of applying a laser beam to the stacked substrate in a condition where a focal point of the laser beam is positioned entirely inside the support substrate at a depth higher in level than a middle of a thickness of the support substrate towards the first surface of the support substrate after performing the grinding step, the laser beam having a transmission wavelength to the support substrate, thereby forming a modified layer as a vibration diffusion layer inside the support substrate at the depth higher in level than the middle towards the first surface of the support substrate, wherein the piezoelectric ceramic substrate faces upwardly during the vibration diffusion layer forming step; and an electrode forming step of forming an electrode pattern on the second surface of the piezoelectric ceramic substrate of the stacked substrate after performing the vibration diffusion layer forming step.

7. The surface acoustic wave device manufacturing method according to claim 2,
wherein the laser beam is applied to the piezoelectric ceramic substrate of the stacked substrate in the vibration diffusion layer forming step.

8. The surface acoustic wave device manufacturing method according to claim 6,
wherein the piezoelectric ceramic substrate is formed of lithium tantalate or lithium niobate, and the support substrate is formed of silicon or sapphire.

9. The surface acoustic wave device manufacturing method according to claim 2, further comprising:
a piezoelectric ceramic substrate protective member applying step of applying a protective member to the second surface of the piezoelectric ceramic substrate,
wherein the piezoelectric ceramic substrate polishing step includes holding the second surface of the piezoelectric ceramic substrate through the piezoelectric ceramic substrate protective member on an upper surface of a chuck table and polishing the first surface of the piezoelectric ceramic substrate.

10. The surface acoustic wave device manufacturing method according to claim 6, further comprising:
a support substrate protective member applying step of applying a protective member to the second surface of the support substrate;
wherein the support substrate polishing step includes holding the second surface of the support substrate through the support substrate protective member on an upper surface of a chuck table and polishing the first surface of the piezoelectric ceramic substrate.

11. The surface acoustic wave device manufacturing method according to claim 6,
wherein the first surface of the piezoelectric ceramic substrate is bonded to the first surface of the support substrate by cold bonding.

12. A surface acoustic wave device manufacturing method comprising:
a piezoelectric ceramic substrate providing step of providing a piezoelectric ceramic substrate having a first surface and a second surface opposite to each other;
a support substrate providing step of providing a support substrate having a first surface and a second surface opposite to each other, the support substrate having a thermal expansion coefficient lower than that of the piezoelectric ceramic substrate;

a piezoelectric ceramic substrate polishing step of polishing the first surface of the piezoelectric ceramic substrate to thereby planarize the first surface of the piezoelectric ceramic substrate;

a support substrate polishing step of polishing the first surface of the support substrate to thereby planarize the first surface of the support substrate;

a bonding step of bonding the first surface of the piezoelectric ceramic substrate to the first surface of the support substrate after performing the piezoelectric ceramic substrate polishing step and the support substrate polishing step, thereby forming a stacked substrate composed of the piezoelectric ceramic substrate and the support substrate;

a grinding step of grinding the second surface of the piezoelectric ceramic substrate of the stacked substrate after performing the bonding step, thereby reducing a thickness of the piezoelectric ceramic substrate to a predetermined thickness;

a vibration diffusion layer forming step of applying a laser beam to the stacked substrate in a condition where a focal point of the laser beam is positioned entirely inside the piezoelectric ceramic substrate at a depth near the first surface of the piezoelectric ceramic substrate after performing the grinding step, the laser beam having a transmission wavelength to the piezoelectric ceramic substrate, thereby forming a modified layer as a vibration diffusion layer inside the piezoelectric ceramic substrate at the depth near the first surface of the piezoelectric ceramic substrate; and an electrode forming step of forming an electrode pattern on the second surface of the piezoelectric ceramic substrate of the stacked substrate after performing the vibration diffusion layer forming step.

13. The surface acoustic wave device manufacturing method according to claim 12,
wherein the laser beam is applied to the piezoelectric ceramic substrate of the stacked substrate in the vibration diffusion layer forming step.

14. The surface acoustic wave device manufacturing method according to claim 12,
wherein the piezoelectric ceramic substrate is formed of lithium tantalate or lithium niobate, and the support substrate is formed of silicon or sapphire.

15. The surface acoustic wave device manufacturing method according to claim 12,
wherein the first surface of the piezoelectric ceramic substrate is bonded to the first surface of the support substrate by cold bonding.

16. The surface acoustic wave device manufacturing method according to claim 12, further comprising:
a piezoelectric ceramic substrate protective member applying step of applying a protective member to the second surface of the piezoelectric ceramic substrate,
wherein the piezoelectric ceramic substrate polishing step includes holding the second surface of the piezoelectric ceramic substrate through the piezoelectric ceramic substrate protective member on an upper surface of a chuck table and polishing the first surface of the piezoelectric ceramic substrate.

17. The surface acoustic wave device manufacturing method according to claim 12, further comprising:
a support substrate protective member applying step of applying a protective member to the second surface of the support substrate;
wherein the support substrate polishing step includes holding the second surface of the support substrate through the support substrate protective member on an upper surface of a chuck table and polishing the first surface of the piezoelectric ceramic substrate.

* * * * *